United States Patent [19]
Lee et al.

[11] Patent Number: 5,546,020
[45] Date of Patent: Aug. 13, 1996

[54] DATA OUTPUT BUFFER WITH LATCH UP PREVENTION

[75] Inventors: Dong M. Lee; Hyeong S. Hong, both of Kyoungki-do, Rep. of Korea

[73] Assignee: Hyundai Electronics Industries Co., Ltd., Kyoungki-do, Rep. of Korea

[21] Appl. No.: 423,860

[22] Filed: Apr. 18, 1995

[30] Foreign Application Priority Data

Apr. 18, 1994 [KR] Rep. of Korea .................. 94-8048

[51] Int. Cl.[6] .................. H03K 19/0175; H03K 19/094
[52] U.S. Cl. ............................... 326/83; 327/534
[58] Field of Search ................. 326/83, 121; 327/534

[56] References Cited

U.S. PATENT DOCUMENTS

| | | | |
|---|---|---|---|
| 5,041,894 | 8/1991 | Reczek et al. | 357/42 |
| 5,381,056 | 1/1995 | Murphy | 326/21 |
| 5,381,061 | 1/1995 | Davis | 326/57 |
| 5,396,128 | 3/1995 | Dunning et al. | 326/68 |
| 5,434,526 | 7/1995 | Tanigashira et al. | 327/389 |

*Primary Examiner*—Edward P. Westin
*Assistant Examiner*—Richard Roseen
*Attorney, Agent, or Firm*—Popham, Haik, Schnobrich & Kaufman, Ltd.

[57] ABSTRACT

A data output buffer comprising a pull-up transistor having an N type-well, the pull-up transistor transferring a supply voltage from a supply voltage source to an output line in response to a logic state of data from an input line, a first PMOS transistor for switching the supply voltage from the supply voltage source to the N type-well of the pull-up transistor in response to a voltage on the output line, and a second PMOS transistor for feeding the voltage on the output line back to the N type-well of the pull-up transistor when the voltage on the output line is higher than the supply voltage from the supply voltage source. According to the present invention, the voltage on the output line can be prevented from being latched up to the supply voltage source when it is higher than the supply voltage from the supply voltage source. Therefore, the data output buffer has an enhanced operation speed and a minimized occupying area in a semiconductor integrated circuit device.

1 Claim, 2 Drawing Sheets

DATA OUTPUT BUFFER WITH LATCH UP PREVENTION

BACKGROUND OF THE INVENTION

1. Field of the Invention

The present invention relates in general to a data output buffer used in a semiconductor integrated circuit device, and more particularly to a data output buffer which is capable of preventing a voltage on an output line from being latched up to a supply voltage source through a pull-up driver when it is higher than a supply voltage from the supply voltage source.

2. Description of the Prior Art

In a semiconductor integrated circuit device, generally, a data output buffer is adapted to buffer data processed by a semiconductor integrated circuit, in such a manner that it can have a sufficient voltage level to drive external peripheral circuits. To this end, the data output buffer comprises a pull-up driver for amplifying the data so that it can have a supply voltage when it is in first logic, and a pull-down driver for amplifying the data so that it can have a ground voltage when it is in second logic. The pull-up driver includes an NMOS or PMOS transistor and the pull-down driver includes an NMOS field effect transistor.

The NMOS type-pull-up driver limits a voltage on an output line to become lower than that on an input line. For this reason, the use of the NMOS type-pull-up driver requires a circuit which boosts data on the input line above the supply voltage when it is in first logic. However, such a boost circuit has a disadvantage in that it degrades an operation speed of the data output buffer or increases a current consumption amount in a standby mode.

On the other hand, the PMOS type-pull-up driver can enhance the operation speed of the data output buffer and reduce the current consumption amount in the standby mode because it requires no boost circuit. However, the PMOS type-pull-up driver has a disadvantage in that the voltage on the output line is latched up to a supply voltage source when it is higher than the supply voltage.

Such problems with the data output buffer will hereinafter be described in detail with reference to FIGS. 1 to 3.

Referring to FIG. 1, there is shown a circuit diagram of a conventional data output buffer. As shown in this drawing, the conventional data output buffer comprises a pull-up NMOS transistor MN1 connected between an output line 15 and a supply voltage source Vcc, a pull-down NMOS transistor MN2 connected between the output line 15 and a ground voltage source Vss, and a boost circuit 10 connected between a gate of the pull-up NMOS transistor MN1 and an output terminal of a NAND gate GN1. The boost circuit 10 is adapted to boost high logic data from the NAND gate GN1 above a supply voltage from the supply voltage source Vcc and apply the boosted data to the gate of the pull-up NMOS transistor MN1. To this end, the boost circuit 10 includes two switching NMOS transistors MN3 and MN4, a charge storing capacitor C1, five inverters GI3–GI7 constituting a delay line, and an inverter GI2 for inverting an output signal from the NAND gate GN1. The conventional data output buffer further comprises two inverters GI1 and GI8, and a NAND gate GN2. When an output enable signal OE from a control line 13 is high in logic, the inverters GI1 and GI8 and the NAND gate GN2 are adapted to invert low logic data DO from an input line 11 into high logic and apply the inverted high logic data to a gate of the pull-down NMOS transistor MN2.

However, the delay line and the capacitor C1 in the boost circuit 10 double the transfer delay of the high logic data from the NAND gate GN1 to the gate of the pull-up NMOS transistor MN1. For this reason, the conventional data output buffer in FIG. 1 has a disadvantage in that it is very low in operation speed.

Referring to FIG. 2, there is shown a circuit diagram of another conventional data output buffer. As shown in this drawing, the conventional data output buffer comprises a pull-up NMOS transistor MN5 connected between an output line 25 and a first supply voltage source Vcc, a pull-down NMOS transistor MN6 connected between the output line 25 and a ground voltage source Vss, and a boost circuit 20 connected between a gate of the pull-up NMOS transistor MN5 and an output terminal of a NAND gate GN3. The boost circuit 20 is adapted to invert low logic data from the NAND gate GN3 into high logic and boost the inverted high logic data to a second supply voltage from a second supply voltage source Vpp which is higher than a first supply voltage from the first supply voltage source Vcc. Then, the boost circuit 20 applies the boosted data to the gate of the pull-up NMOS transistor MN5. To this end, the boost circuit 20 includes two NMOS transistors MN7 and MN8 being complementarily operated in response to an output signal from the NAND gate GN3, and two PMOS transistors MP1 and MP2 being latched between the second supply voltage source Vpp and the two NMOS transistors MN7 and MN8. The boost circuit 20 further includes a PMOS transistor MP3 being operated in response to an output signal from the latched PMOS transistors MP1 and MP2, an NMOS transistor MN9 being operated in response to the output signal from the NAND gate GN3, and an inverter GI9 for inverting the output signal from the NAND gate GN3 and applying the inverted signal to a gate of the NMOS transistor MN5. The NAND gate GN3 functions to invert data DO from an input line 21 when an output enable signal OE from a control line 23 is high in logic. The conventional data output buffer further comprises two inverters GI10 and GI11 for delaying the output signal from the NAND gate GN3 by a period corresponding to the sum of propagation delay times thereof and applying the delayed signal to a gate of the pull-down NMOS transistor MN6.

However, when the pull-up NMOS transistor MN5 is not operated, the NMOS transistor MN7 is turned on to mute the second supply voltage, which is supplied from the second supply voltage source Vpp through the PMOS transistor MP1, to the ground voltage source Vss. For this reason, the conventional data output buffer in FIG. 2 has a disadvantage in that it increases an unnecessary current consumption amount.

Furthermore, in the conventional data output buffers having the NMOS type-pull-up transistor as shown in FIGS. 1 and 2, the use of the boost circuit requires a large occupying area in the semiconductor integrated circuit device, resulting in a reduction in an integration degree of the semiconductor integrated circuit device.

Referring to FIG. 3, there is shown a circuit diagram of a further conventional data output buffer. As shown in this drawing, the conventional data output buffer comprises a pull-up PMOS transistor MP4 connected between an output line 35 and a supply voltage source Vcc, and a pull-down NMOS transistor MN10 connected between the output line 35 and a ground voltage source Vss. The pull-up PMOS transistor MP4 has an advantage in that it transfers to the output line 35 a voltage higher than that of data which is supplied from a NAND gate GN4 through an NMOS transistor MN11. However, the pull-up PMOS transistor MP4 has a disadvantage in that it transfers a voltage on the output line 35 to the supply voltage source Vcc when the voltage on the output line 35 is higher than a supply voltage from the supply voltage source Vcc.

The conventional data output buffer further comprises a PMOS transistor MP6 connected among the supply voltage source Vcc, the output line 35 and a bulk node (i.e., an N type-well) 37 of the pull-up PMOS transistor MP4. The PMOS transistor MP6 has a gate for inputting the voltage Dout from the output line 35 and a source connected to the supply voltage source Vcc. When the voltage Dout from the output line 35 is lower than the supply voltage from the supply voltage source Vcc by a threshold voltage Vtp1 of the PMOS transistor MP6 or more, namely, Dout<Vcc−Vtp1, the PMOS transistor MP6 applies the supply voltage from the supply voltage source Vcc to the bulk node 37 of the pull-up PMOS transistor MP4 to operate the pull-up PMOS transistor MP4 stably.

Also, in the case where the voltage Dout on the output line 35 is present between the difference between the supply voltage from the supply voltage source Vcc and the threshold voltage Vtp1 of the PMOS transistor MP6 and the sum of the supply voltage from the supply voltage source Vcc and a voltage Vd for turning on a P-N junction of the pull-up PMOS transistor MP4, the pull-up PMOS transistor MP4 reduces a current path between the supply voltage source Vcc and the output line 35 as the bulk node 37 thereof remains at its floating state.

On the other hand, in the case where the voltage Dout on the output line 35 is higher than the sum of the supply voltage from the supply voltage source Vcc and the P-N junction turning-on voltage Vd of the pull-up PMOS transistor MP4, it is latched up to the supply voltage source Vcc. Also in this case, the bulk node 37 of the pull-up PMOS transistor MP4 remains at a voltage (Dout-Vd) which is lower by the P-N junction turning-on voltage Vd of the pull-up PMOS transistor or MP4 than the voltage Dout on the output line 35.

The conventional data output buffer further comprises a variable resistor 30 connected between an output terminal of the NAND gate GN4 and a gate of the pull-up PMOS transistor MP4, and a PMOS transistor MP7 connected between the gate of the pull-up PMOS transistor MP4 and the output line 35. The variable resistor 30 is adapted to adjust an amount of current flowing from the NAND gate GN4 to the gate of the pull-up PMOS transistor MP4, according to a logic state of data on the output line 35. To this end, The variable resistor 30 includes the NMOS transistor MN11 and a PMOS transistor MPS. The NMOS transistor MN11 has a gate connected to the supply voltage source Vcc and the PMOS transistor MP5 has a gate connected to the output line 35. On the other hand, when the voltage on the output line 35 is higher than the sum of the supply voltage from the supply voltage source Vcc and a threshold voltage Vtp2 of the PMOS transistor MP7, the PMOS transistor MP7 feeds the voltage on the output line 35 back to the gate of the pull-up PMOS transistor MP4 to force the pull-up PMOS transistor MP4 to be turned off.

Furthermore, the conventional data output buffer comprises two inverters GI12 and GI13, and a NAND gate GN5. When an output enable signal OE from a control line 33 is high in logic, the inverters GI12 and GI13 and the NAND gate GN5 are adapted to invert data DO from an input line 31 and apply the inverted data to a gate of the pull-down NMOS transistor MN10. On the other hand, the NAND gate GN4 functions to invert the data DO from the input line 31 when the output enable signal OE from the control line 33 is high in logic. The NAND gate GN4 then applies the inverted data to the gate of the pull-up PMOS transistor MP4 through the variable resistor 30.

As mentioned above, the conventional data output buffer in FIG. 3 is desirable to overcome the problems with the conventional data output buffers in FIGS. 1 and 2, but has the disadvantage that the voltage on the output line is latched up to the supply voltage source.

SUMMARY OF THE INVENTION

Therefore, the present invention has been made in view of the above problems, and it is an object of the present invention to provide a data output buffer which is capable of preventing a voltage on an output line from being latched up to a supply voltage source and enhancing an operation speed.

In accordance with the present invention, the above and other objects can be accomplished by a provision of a data output buffer comprising a pull-up transistor having an N type-well, the pull-up transistor transferring a supply voltage from a supply voltage source to an output line in response to a logic state of data from an input line; switching means for switching the supply voltage from the supply voltage source to the N type-well of the pull-up transistor in response to a voltage on the output line; and feedback means for feeding the voltage on the output line back to the N type-well of the pull-up transistor when the voltage on the output line is higher than the supply voltage from the supply voltage source.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
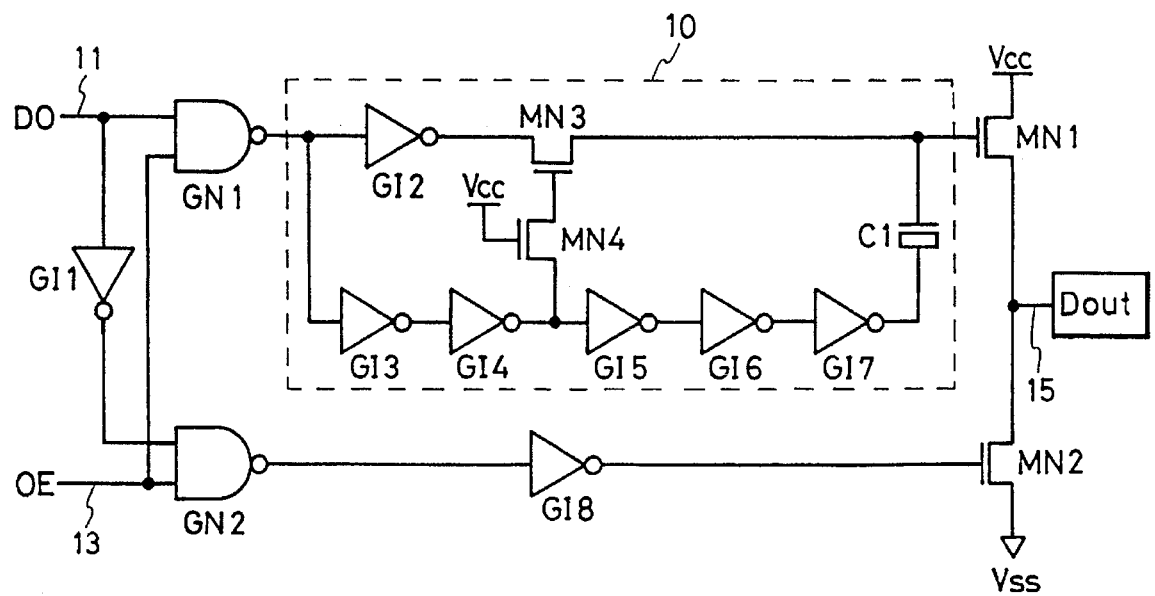
FIG. 1 is a circuit diagram of a conventional data output buffer.
Figure 2:
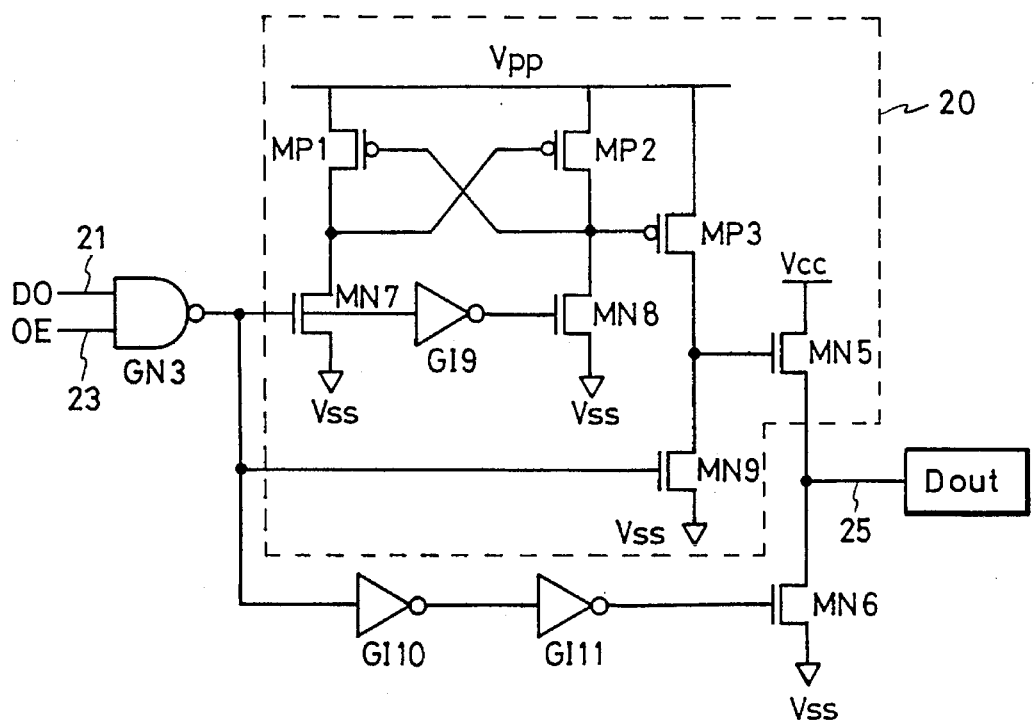
FIG. 2 is a circuit diagram of another conventional data output buffer.
Figure 3:
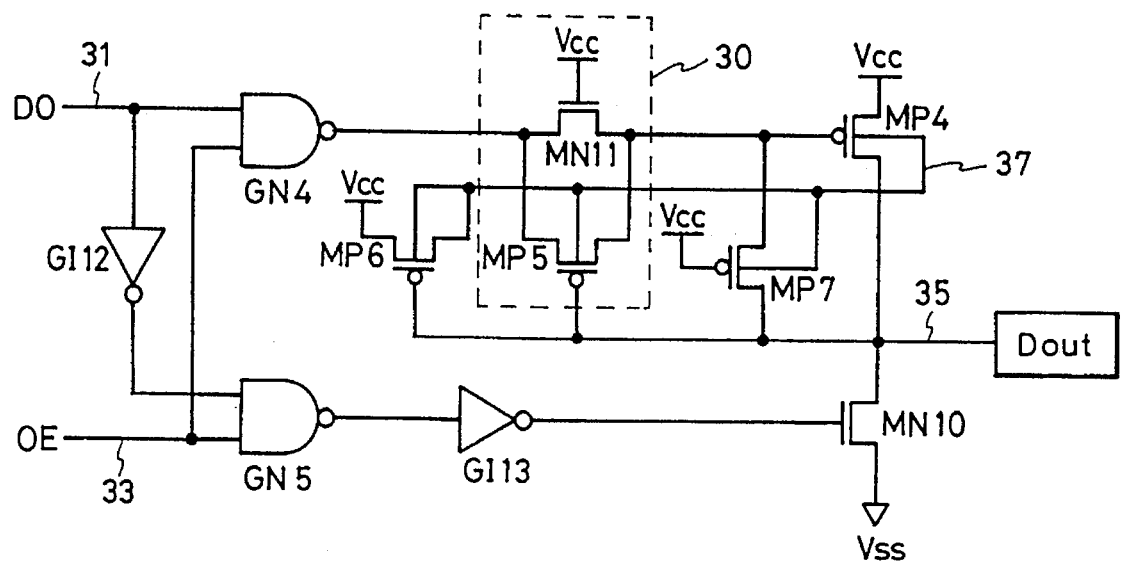
FIG. 3 is a circuit diagram of a further conventional data output buffer.
Figure 4:
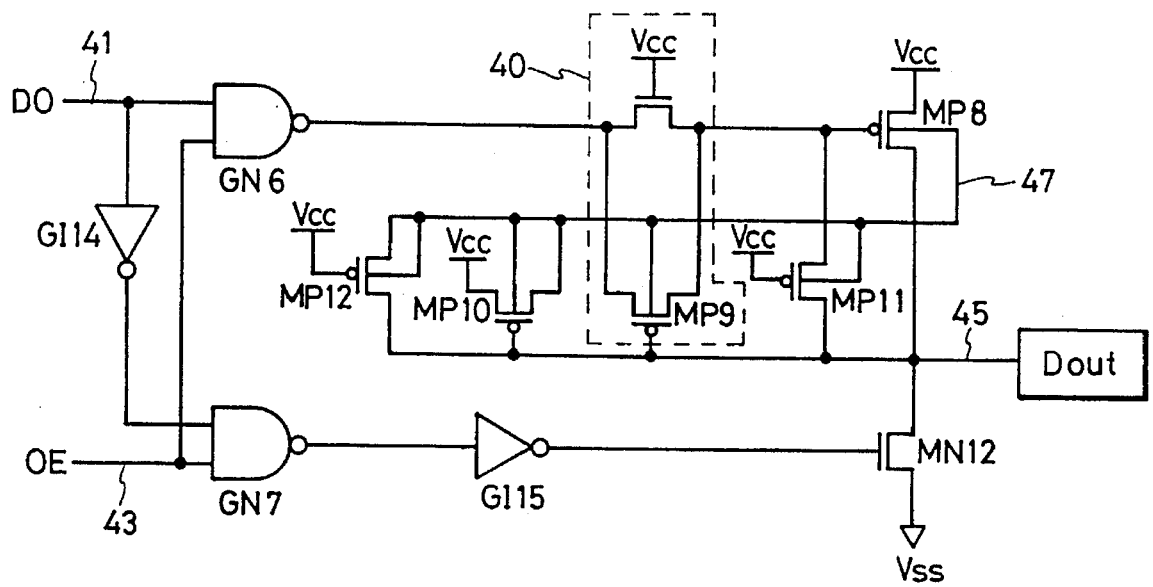
FIG. 4 is a circuit diagram of a data output buffer in accordance with an embodiment of the present invention.

Referring to FIG. 4, there is shown a circuit diagram of a data output buffer in accordance with an embodiment of the present invention. As shown in this drawing, the data output buffer comprises a pull-up PMOS transistor MP8 connected between an output line 45 and a supply voltage source Vcc, and a pull-down NMOS transistor MN12 connected between the output line 45 and a ground voltage source Vss. The pull-up PMOS transistor MP8 has a gate for inputting data from a NAND gate GN6 through a variable resistor When the data from the NAND gate GN6 is low in logic, the pull-up PMOS transistor MP8 transfers a supply voltage from the supply voltage source Vcc to the output line 45. The NAND gate GN6 functions to invert data DO from an input line 41 when an output enable signal OE from a control line 43 is high in logic. The NAND gate GN6 then applies the inverted data to the gate of the pull-up PMOS transistor MP8 through the variable resistor 40.

The variable resistor 40 is adapted to adjust an amount of current flowing from an output terminal of the NAND gate GN6 to the gate of the pull-up PMOS transistor MP8, according to a logic state of data on the output line 45. In more detail, when the data on the output line 45 is high in logic, the variable resistor 40 reduces the amount of current flowing to the gate of the pull-up PMOS transistor MP8. On the contrary, when the data on the output line 45 is low in logic, the variable resistor 40 increases the amount of current flowing to the gate of the pull-up PMOS transistor MP8. To this end, the variable resistor 40 includes an NMOS transistor MN13 and a PMOS transistor MP9 connected in parallel between the output terminal of the NAND gate GN6 and the gate of the pull-up PMOS transistor MP8. The NMOS transistor MN13 has a gate for inputting the supply voltage from the supply voltage source Vcc. As a result, the NMOS transistor MN13 always remains at its ON state. On the other hand, the PMOS transistor MP9 has a gate for inputting the data on the output line 45. When the data on the output line 45 is low in logic, the PMOS transistor MP9 is turned on to reduce a resistance between the output terminal of the NAND gate GN6 and the gate of the pull-up PMOS transistor MP8. On the contrary, when the data on the output line 45 is high in logic, the PMOS transistor MP9 is turned off to increase the resistance between the output terminal of the NAND gate GN6 and the gate of the pull-up PMOS transistor MP8.

The data output buffer further comprises an inverter GI14 for inverting the data DO from the input line 41, and a NAND gate GN7 for inputting an output signal from the inverter GI14 and the output enable signal OE from the control line 43. When the output enable signal OE from the control line 43 is high in logic, the NAND gate GN7 inverts the output signal from the inverter GI14. In result, the NAND gate GN7 generates a low logic signal only when the output enable signal OE from the control line 43 is high in logic and the data DO from the input line 41 is low in logic. The data output buffer further comprises an inverter GI15 for inverting an output signal from the NAND gate GN7 and applying the inverted signal to a gate of the pull-down NMOS transistor MN12. When an output signal from the inverter GI15 is high in logic, the pull-down NMOS transistor MN12 is turned on to mute the voltage on the output line 45 to the ground voltage source Vss.

Further, the data output buffer comprises a PMOS transistor MP10 connected between the supply voltage source Vcc and a bulk node (i.e., an N type-well) 47 of the pull-up PMOS transistor MP8, and a PMOS transistor MP11 connected between the gate of the pull-up PMOS transistor MP8 and the output line 45. The PMOS transistor MP10 has a gate for inputting the voltage Dout from the output line 45 and a source connected to the supply voltage source Vcc. When the voltage Dout from the output line 45 is lower than the supply voltage from the supply voltage source Vcc by a threshold voltage Vtp3 of the PMOS transistor MP10 or more, namely, Dout<Vcc−Vtp3, the PMOS transistor MP10 applies the supply voltage from the supply voltage source Vcc to the bulk node 47 of the pull-up PMOS transistor MP8 to operate the pull-up PMOS transistor MP8 stably. On the other hand, when the voltage on the output line 45 is higher than the sum of the supply voltage from the supply voltage source Vcc and a threshold voltage Vtp4 of the PMOS transistor MP11, the PMOS transistor MP11 feeds the voltage on the output line 45 back to the gate of the pull-up PMOS transistor MP8 to force the pull-up PMOS transistor MP8 to be turned off.

Furthermore, the data output buffer comprises a PMOS transistor MP12 connected between the output line 45 and the bulk node 47 of the pull-up PMOS transistor MP8. The PMOS transistor MP12 has a gate connected to the supply voltage source Vcc. When the voltage on the output line 45 is higher than or equal to the sum of the supply voltage from the supply voltage source Vcc and a threshold voltage Vtp5 of the PMOS transistor MP12, namely, Dout≧VCC+Vtp5, the PMOS transistor MP12 feeds the voltage on the output line 45 back to the bulk node 47 of the pull-up PMOS transistor MP8. As a result, the same voltage is present on the bulk node 47 of the pull-up PMOS transistor MP8 and the output line 45. Therefore, the voltage Dout on the output line 45 is not latched up to the supply voltage source Vcc through the pull-up PMOS transistor MP8. The reason is that the suppression is applied with respect to the movement of holes from the output line 45 to the bulk node 47 of the pull-up PMOS transistor MP8 through a drain diffusion region (not shown) of the pull-up PMOS transistor MP8. To this end, the threshold voltage Vtp5 of the PMOS transistor MP12 is set to become lower than a voltage Vd for turning on a P-N junction of the pull-up PMOS transistor MP8. The P-N junction of the pull-up PMOS transistor MP8 signifies a junction between the drain diffusion region and the bulk node (i.e., the N type-well) 47 of the pull-up PMOS transistor MPS.

Also, bulk nodes of the four PMOS transistors MP9, MP10, MP11 and MP12 are connected in common to the bulk node 47 of the pull-up PMOS transistor MP8.

As apparent from the above description, according to the present invention, the voltage on the output line is fed back to the bulk node of the pull-up PMOS transistor so that it can be prevented from being latched up to the supply voltage source. Moreover, the data output buffer of the present invention has an enhanced operation speed and a reduced occupying area in the semiconductor integrated circuit device as compared with that with a NMOS type-pull-up transistor.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A data output buffer, comprising:

a pull-up transistor having an N-type well and transferring a supply voltage from a supply voltage source to an output line in response to a logic state of data from an input line;

switching means for switching the supply voltage from the supply voltage source to the N-type well of the pull-up transistor in response to a voltage on the output line; and feedback means for feeding the voltage on the output line back to the N-type well of the pull-up transistor when the voltage on the output line is higher than the supply voltage from the supply voltage source;

wherein the feedback means includes a PMOS transistor having a gate connected to the supply voltage source, a drain connected to the N-type well of the pull-up transistor, and a source connected to the output line; and the PMOS transistor has a threshold voltage lower than a voltage for turning on a junction between a drain and the N-type well of the pull-up transistor.

* * * * *